US012638785B2

(12) United States Patent
Garcia Granda et al.

(10) Patent No.: US 12,638,785 B2
(45) Date of Patent: May 26, 2026

(54) METHODS FOR MEASURING AT LEAST ONE TARGET ON A SUBSTRATE AND ASSOCIATED APPARATUSES AND SUBSTRATE

(71) Applicant: ASML Netherlands B.V., Veldhoven (NL)

(72) Inventors: Miguel Garcia Granda, Veldhoven (NL); Karel Hendrik Wouter Van Den Bos, Oss (NL); Jort Adrianus Thomas Jacobs, Eindhoven (NL); Cheng-Teng Yueh, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 18/697,656

(22) PCT Filed: Sep. 23, 2022

(86) PCT No.: PCT/EP2022/076524
§ 371 (c)(1),
(2) Date: Apr. 1, 2024

(87) PCT Pub. No.: WO2023/057237
PCT Pub. Date: Apr. 13, 2023

(65) Prior Publication Data
US 2025/0231496 A1     Jul. 17, 2025

(30) Foreign Application Priority Data
Oct. 4, 2021     (EP) .................................... 21200798

(51) Int. Cl.
*G03F 7/00* (2006.01)
(52) U.S. Cl.
CPC ...... *G03F 7/70641* (2013.01); *G03F 7/70633* (2013.01); *G03F 7/706845* (2023.05)

(58) Field of Classification Search
CPC ........... G03F 7/706845; G03F 7/70683; G03F 7/70641; G03F 7/70633; G03F 7/706835;
(Continued)

(56) References Cited

U.S. PATENT DOCUMENTS 6,952,253 B2    10/2005  Lof et al.
7,701,577 B2     4/2010  Straaijer et al.
(Continued)

FOREIGN PATENT DOCUMENTS

| EP | 1 628 164 A2 | 2/2006 |
| TW | 2019-45864 A | 12/2019 |
| TW | 2020-20468 A | 6/2020 |

OTHER PUBLICATIONS

International Search Report and Written Opinion of the International Searching Authority directed to International Patent Application No. PCT/EP2022/076524, mailed Dec. 22, 2022; 10 pages.

*Primary Examiner* — Steven H Whitesell
(74) *Attorney, Agent, or Firm* — Finnegan, Henderson, Farabow, Garrett & Dunner LLP

(57)     ABSTRACT

Disclosed is a method of determining a correction for a measurement of at least one target on a substrate, the target comprising one or more parameter of interest sensitive sub-targets which are each sensitive to a parameter of interest and one or more parameter of interest insensitive sub-targets which are substantially less sensitive or insensitive to the parameter of interest, the method comprising. The method comprises obtaining a respective first measurement parameter value relating to each of said one or more parameter of interest sensitive sub-targets; obtaining a respective second measurement parameter value relating to each of said one or more parameter of interest insensitive sub-targets; and determining a correction for each said first measurement parameter value using said second measurement parameter values and/or detecting the presence of an (Continued)

effect likely to impact accuracy of first measurement parameter values from said second measurement parameter values.

15 Claims, 5 Drawing Sheets

(58) Field of Classification Search
CPC ............. G03F 7/706837; G03F 7/7065; G03F 7/70625; G03F 7/70616
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,551,750 | B2 | 2/2020 | Urbanczyk et al. |
| 11,709,436 | B2 | 7/2023 | Tinnemans et al. |
| 2005/0185174 | A1 | 8/2005 | Laan et al. |
| 2006/0132744 | A1 | 6/2006 | Hauschild et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2015/0293458 | A1* | 10/2015 | Vanoppen ........... G03F 7/70558 |
| | | | 355/53 |
| 2015/0338749 | A1* | 11/2015 | Hinnen ............... G03F 7/70641 |
| | | | 356/123 |
| 2018/0373167 | A1 | 12/2018 | Grunzweig et al. |

* cited by examiner

METHODS FOR MEASURING AT LEAST ONE TARGET ON A SUBSTRATE AND ASSOCIATED APPARATUSES AND SUBSTRATE

CROSS-REFERENCE TO RELATED APPLICATIONS

This application claims priority of EP application 21200798.3 which was filed on Oct. 4, 2021 and which is incorporated herein in its entirety by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD=k1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure and scatterometry based tools for inspecting/measuring the exposed and/or etched product in process control; e.g., to measure overlay.

SUMMARY

In a first aspect of the invention there is provided a method of determining a correction for respective measurements of one or more targets comprising a plurality of parameter of interest insensitive sub-targets on a substrate, said one or more targets comprising a plurality of parameter of interest insensitive sub-targets such that each target comprises one or more of said parameter of interest sensitive sub-targets which are each sensitive to a parameter of interest and one or more parameter of interest insensitive sub-targets which are substantially less sensitive or insensitive to the parameter of interest, the method comprising: obtaining a respective first measurement parameter value relating to each of said one or more parameter of interest sensitive sub-targets; obtaining a plurality of second measurement parameter values, said plurality of second measurement parameter values comprising a respective second measurement parameter value relating to each of said plurality of parameter of interest insensitive sub-targets, at least some of said plurality of second measurement parameter values relating to a different region of a measurement beam used to measure said one or more targets; and determining a spot inhomogeneity correction which corrects for inhomogeneity of said measurement beam, for each said first measurement parameter value using said second measurement parameter values.

In a second aspect of the invention there is provided a a plurality of targets, each target comprising one or more parameter of interest sensitive sub-targets which are each sensitive to a parameter of interest and one or more parameter of interest insensitive sub-targets which are substantially less sensitive or insensitive to the parameter of interest; and wherein the position of at least one of said one or more parameter of interest insensitive sub-targets is varied within the target with respect to each of said one or more parameter of interest sensitive sub-targets, for respective different targets of said plurality of targets.

The invention yet further provides a computer program product comprising machine-readable instructions for causing a processor to perform the method of the first aspect, and associated metrology apparatus.

The above and other aspects of the invention will be understood from a consideration of the examples described below.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figures 1, 2:
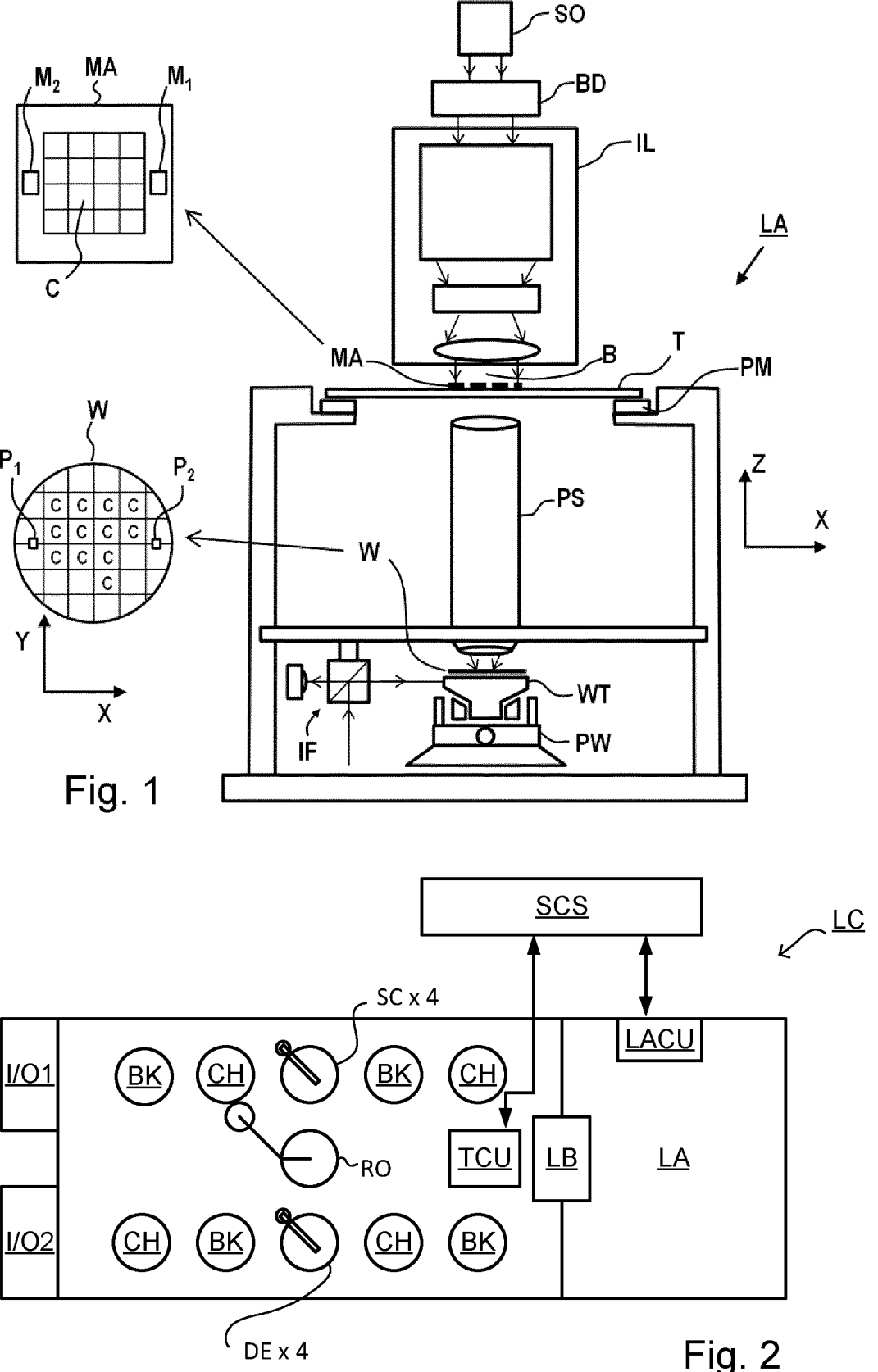
FIG. 1 depicts a schematic overview of a lithographic apparatus.
FIG. 2 depicts a schematic overview of a lithographic cell.

FIG. 1 schematically depicts a lithographic apparatus LA or scanner (the two terms are used synonymously, although the concepts herein may also be applicable to stepper arrangements). The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
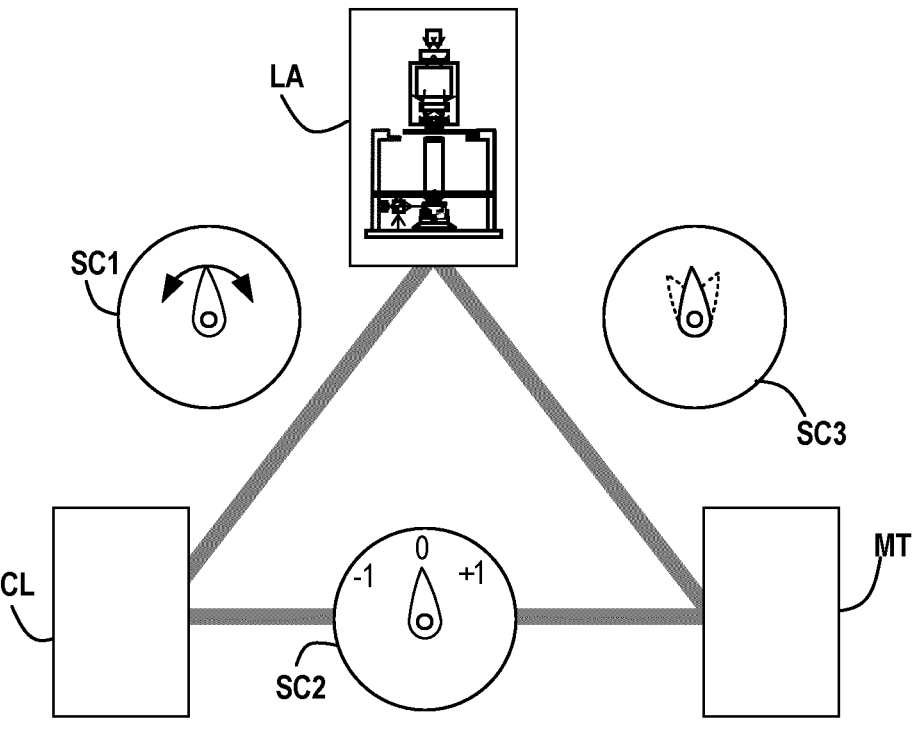
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target arrangement and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

Figure 4:
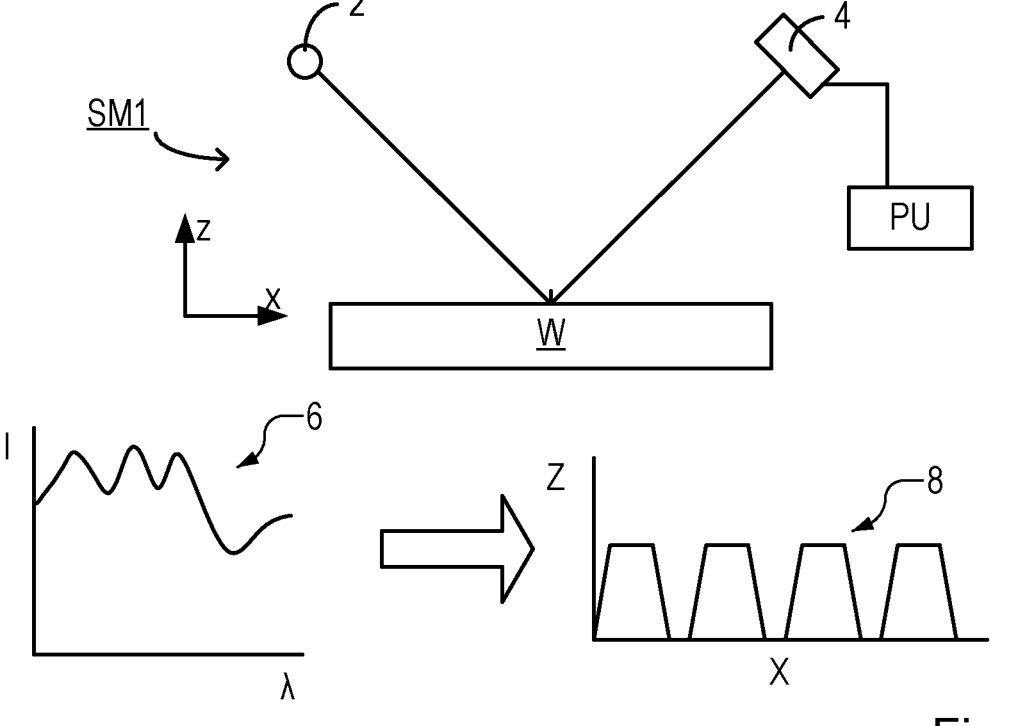
FIG. 4 depicts a schematic overview of a scatterometry apparatus used as a metrology device, for use in methods according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

FIG. 5(*a*) presents an embodiment of a metrology apparatus and, more specifically, a dark field scatterometer. A target T and diffracted rays of measurement radiation used to illuminate the target are illustrated in more detail in FIG. 5(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the illumination angles can be designed or adjusted so that the first order rays entering the objective lens are closely aligned with the central optical axis. The rays illustrated in FIGS. 5(*a*) and 5(*b*) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction. The concepts disclosed herein relate to pupil measurements using this branch.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present. The particular forms of aperture plate 13 and field stop 21 shown in FIGS. 5(*a*), 5(*c*) and 5(*d*) are purely examples.

Figures 5A, 5B, 5C, 5D, 6, 7:
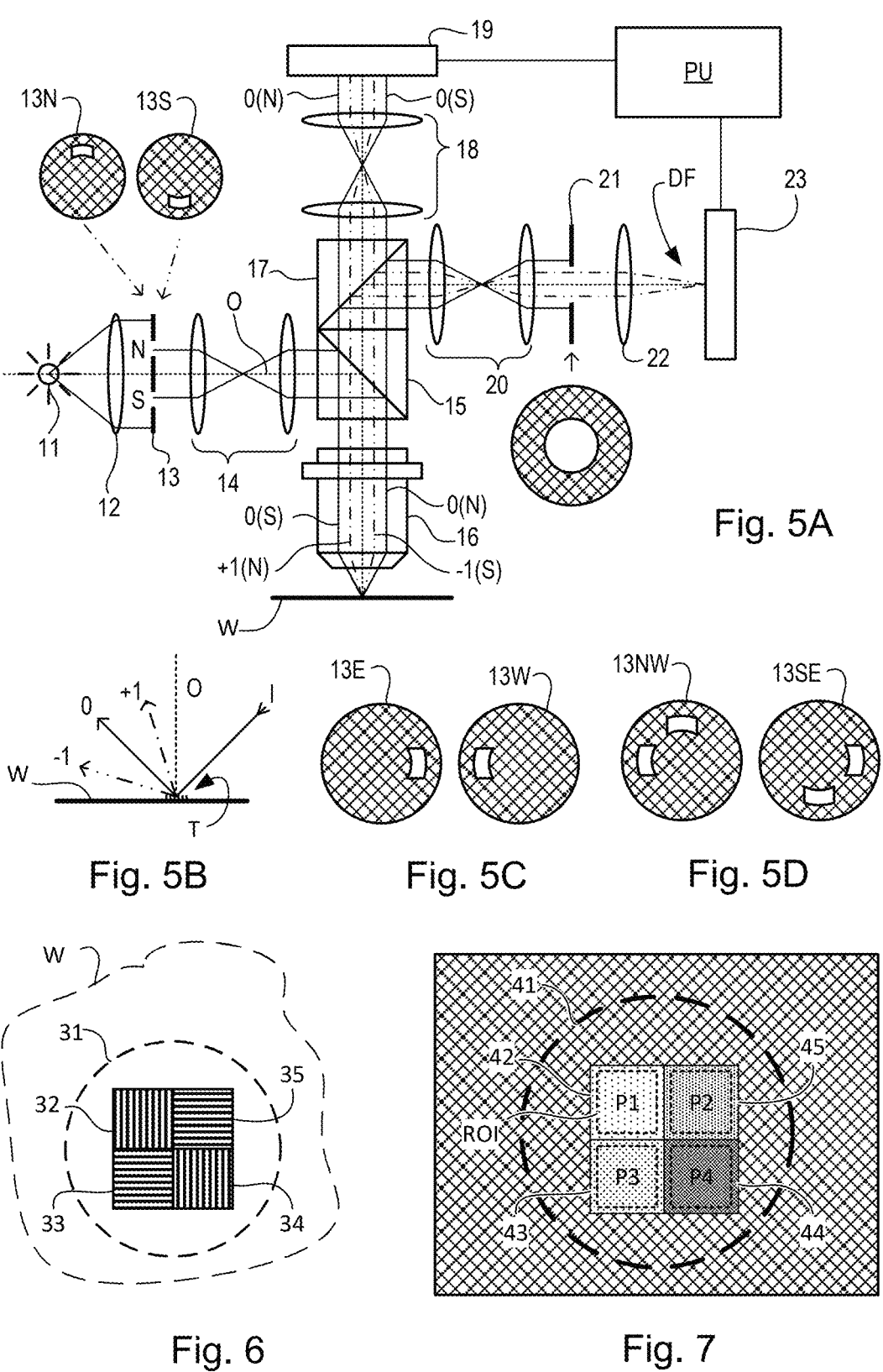
FIG. 5A illustrates a schematic diagram of a pupil and dark field scatterometer for use in methods according to embodiments of the invention using a first pair of illumination apertures.
FIG. 5B illustrates a detail of diffraction spectrum of a target grating for a given direction of illumination.
FIGS. 5C and 5D illustrate exemplary aperture plates.
FIG. 6 depicts a known form of multiple grating target and an outline of a measurement spot on a substrate.
FIG. 7 depicts an image of the target of FIG. 6 obtained in the scatterometer of FIG. 5A.

FIG. 6 depicts a composite target formed on a substrate according to known practice. The composite target comprises four sub-targets or dual-layer gratings 32 to 35 positioned closely together so that they will all be within a measurement spot 31 formed by the illumination beam of the metrology apparatus. The four sub-targets thus are all simultaneously illuminated and simultaneously imaged on sensors 19 and 23. In an example dedicated to overlay measurement, gratings 32 to 35 are formed by overlying gratings that are patterned in different layers of the semi-conductor device formed on substrate W. Gratings 32 to 35 may have differently biased overlay offsets (deliberate positional offsets between the gratings in their respective layers) in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23.

FIG. 7 shows an example of an image that may be formed on and detected by the sensor 23, using the target of FIG. 6 in the apparatus of FIG. 5(*a*), using the aperture plates 13NW or 13SE from FIG. 5(*d*). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Another important parameter of a lithographic process which may be monitored is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Metrology targets including certain focus metrology patterns may be printed on the substrate, at the same time as product features are printed. Measurement of these printed patterns may be measured using for example diffraction based techniques, for example using the apparatus of FIG. 5(a). To allow the use of small targets, these measurements may be performed using the dark-field imaging branch of the apparatus. Diffraction-based measurements can also be made using the pupil imaging branch, however. Of course, the apparatus shown in FIG. 5(a) is only one example of an inspection apparatus and method that may be used to perform focus or overlay measurements.

An example of targets suitable for focus monitoring include those often referred to as diffraction-based focus (DBF or μDBF) targets. A known type of DBF target is produced by providing sub-segmented features in a grating pattern on the reticle. These features have dimensions below the imaging resolution of the lithographic apparatus, alongside more solid (larger) features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 5(a) can measure the degree of asymmetry from a target formed on the substrate, and translate this into the scanner focus.

In optical wafer metrology, the measurements are typically impacted by artifacts originating either on the measurement tool, on the metrology target or on the measured wafer. Some of the most important artifacts are spot inhomogeneity (sometimes abbreviated as "spoho"), sensor asymmetry, stack cross-talk, ghost intensity and parallax effects. Each of these phenomena, the present methods of addressing them and the drawbacks with these present methods will be described below.

In the presence of spot inhomogeneity, the measurement spot which illuminates the target is not perfectly homogeneous and some parts of the target receive more light than others. This can be measured as an asymmetry and therefore interpreted as a variation of the parameter of interest (e.g., scanner focus or overlay) instead of as a simple intensity variation. Both the spatial layout of the measured target and small inaccuracies in placing the targets at the center of the illumination spot contribute to errors due to spot inhomogeneity.

The existing technology to address spot inhomogeneity comprise mainly two main approaches: spot inhomogeneity inline calibrations and run-time micro-move. Spot inhomogeneity inline calibration comprises measuring a target at different positions within the illumination spot, using the same illumination condition (e.g., wavelength and polarization combination) as will be used for the actual measurement of the target in a manufacturing setting (e.g., high volume manufacturing or HVM setting). From these acquisitions, a static map of the spot intensities can be made which can be later used during HVM, to correct the measured intensities from the target. Image-based spot inhomogeneity inline calibration comprises illuminating a large diffractive target with the same illumination condition as will be used in HVM setting. An intensity map is recorded for later correction. In either case spot inhomogeneity inline calibrations require wafer overhead time. Because of this, the scanning is limited to few points, limiting both the accuracy and precision of the intensity map.

Run-time micro-move comprises measuring every target that is to be measured in at least two acquisitions, each time with a position offset which calibration for an average impact of the spot inhomogeneity between two (or more) parts of the target. However, micro-move notably reduces metrology throughput and it only works in average terms between two (or more) fixed positions of the target.

As has been discussed, when using a dark field scatterometer such as the apparatus illustrated in FIG. 5(a), both focus and overlay targets measure differences between diffraction orders and/or between diffracted light from different parts of the target. Therefore, any asymmetry in the sensor (e.g., caused by illumination profiles or by the optical system) directly impacts the accuracy of the measurement.

A first type of sensor asymmetry inline correction comprises measuring a target at different orientations: e.g., a first orientation (with respect to the sensor) placing the target at a first wafer position and a second orientation placing the target at a second wafer position. The two orientations are typically 0 degrees and 180 degrees rotations, which allows measurement of an asymmetry factor which can later be used to calibrate the actual measurements. A refinement of this comprises measuring multiple targets at multiple wafer locations, thereby allowing for wafer-position dependent correction. However, sensor asymmetry corrections require wafer overhead time. They (at least in the simpler implementations) may not take into account variations in asymmetry which are dependent on wafer position, e.g., due to stack variation or wafer tilt. Making asymmetry corrections more accurate requires longer wafer overhead time.

Variations in the wafer stack beneath the metrology target can impact the measurement of the parameter of interest (e.g., focus or overlay) by tuning the intensity of the diffracted orders. This results in a process variation being detected as a focus or overlay variations (stack crosstalk). There are currently no methods to calibrate for the impact of process variations, only to detect it. Process monitoring indicators (for example, "Normalized Distance" for focus metrology) attempt to detect variation as a secondary parameter of the measured target (such as correlation between asymmetry and total intensity). These indicators are entangled with the signal from the parameter of interest, and therefore they can be blind to small variations that may already cause measurement inaccuracies.

Ghost intensity appears as light is scattered by components within the optical system (internal ghost) or by objects outside the optical system, e.g., the measured wafer (external ghost). Internal ghosts may be corrected by recording images when the system is pointed at a beam dump and subtracting these ghost images from all the measurement images. For external ghosts, images may be recorded when the system is pointed at a reflector (e.g., a reflecting reference substrate) and again subtracted from the measurement images. While the internal ghost corrections are effective, the external ghost corrections suffer from not being measured on the same stack as that on which the metrology targets are placed. This means that the real external ghost experienced during measurement will always be different than the one measured during external ghost calibration.

Parallax effects may occur when there are thick and transparent stacks below the metrology target. Reflections of the diffracted light from the target or nearby structures can be seen overlapping with the image of the metrology target. This leads to inaccurate asymmetry measurements, resulting in errors in computed focus or overlay. There are currently no ways to calibrate or detect these effects; it is presently not possible to distinguish these effects from real to focus or overlay variations.

A new target design concept, and associated metrology method, is disclosed herein which aims to detect and/or correct one or more of the issues described above, without requiring neither additional overhead time nor throughput reduction.

The main proposal comprises providing a target which is designed and/or optimized for a particular parameter of interest (e.g., focus or overlay) and that includes one or more symmetrical periodic structures or gratings e.g., in the form of grating or line-space (LS) calibration pads or sub-targets. These grating calibration sub-targets may be comprised within a single layer. The grating calibration sub-targets may comprise the same (or similar) pitch and (when possible) CD as the metrology gratings, but lack the feature(s) that creates the dependency on the parameter of interest. Optionally, one or more other reflective (or empty) calibration sub-targets or target pads may comprise purely reflective regions (e.g., blank wafer regions).

The reason that the grating calibration sub-targets should have the same or similar pitch and CD as the parameter of interest sensitive sub-targets is that it becomes easier to acquire both types of sub-targets in one image. If the CD is very different, the calibration grating may be too bright in comparison to the parameter of interest sensitive targets (or vice versa) and consequently two acquisitions with different settings may be required to get a good signal. This similarity of pitch and/or CD should be such that both sets of sub-targets produce an optimal intensity signal under the same illumination conditions, where optimal may be understood to be in relation to the dynamic range capabilities of the sensor.

As such, disclosed herein is a method of determining a correction for respective measurements of one or more targets comprising a plurality of parameter of interest insensitive sub-targets on a substrate, said one or more targets comprising a plurality of parameter of interest insensitive sub-targets such that each target comprises one or more of said parameter of interest sensitive sub-targets which are each sensitive to a parameter of interest and one or more parameter of interest insensitive sub-targets which are substantially less sensitive or insensitive to the parameter of interest, the method comprising: obtaining a respective first measurement parameter value relating to each of said one or more parameter of interest sensitive sub-targets; obtaining a plurality of second measurement parameter values, said plurality of second measurement parameter values comprising a respective second measurement parameter value relating to each of said plurality of parameter of interest insensitive sub-targets, at least some of said plurality of second measurement parameter values relating to a different region of a measurement beam (or measurement spot) used to measure said one or more targets; and determining a spot inhomogeneity correction which corrects for inhomogeneity of said measurement beam, for each said first measurement parameter value using said second measurement parameter values.

At least some of said parameter of interest insensitive sub-targets may each comprise a periodic calibration sub-target comprising a symmetric periodic structure, such as a line-space grating.

The second measurement parameter values may comprise intensity values or a related metric of at least one diffraction order of diffracted radiation from each of said plurality of parameter of interest insensitive sub-targets. The method may comprise determining an intensity map describing intensity within at least one or more portions of the measurement beam; and determining said spot inhomogeneity correction from said intensity map.

At least one of said one or more targets each comprises a plurality of parameter of interest insensitive sub-targets, e.g., such that they will each be measured within different regions of a measurement beam. Alternatively, or in addition, the one or more targets may comprise a plurality of targets on said substrate, such that the position of at least one of said one or more parameter of interest insensitive sub-targets is varied within the target with respect to each of said one or more parameter of interest sensitive sub-targets, for respective different targets of said plurality of targets, e.g., such that they will each be measured within different regions of a measurement beam for measurements of different targets.

Each measurement of a respective target may be captured within a single acquisition with said target within the measurement beam. The first measurement parameter value(s) and the second measurement parameter values may be obtained via scatterometry measurements at an image plane.

Other effects and errors can be additionally corrected using such a target, as will be further described.

Figure 8A:
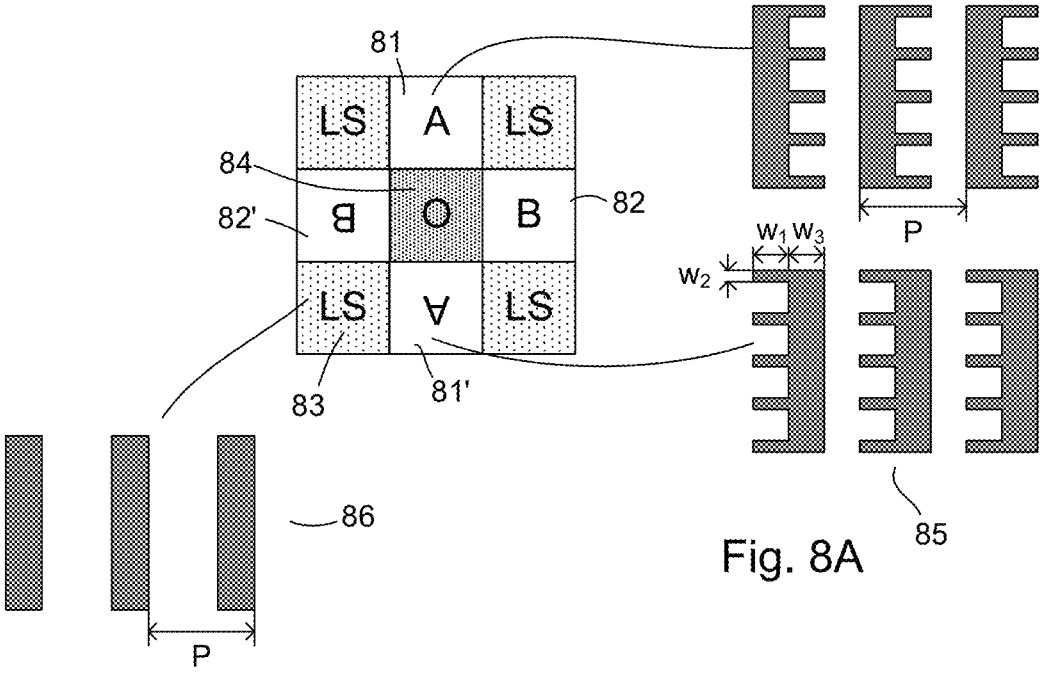
FIG. 8A schematically depicts (a) a focus target according to an embodiment.
Figure 8B:
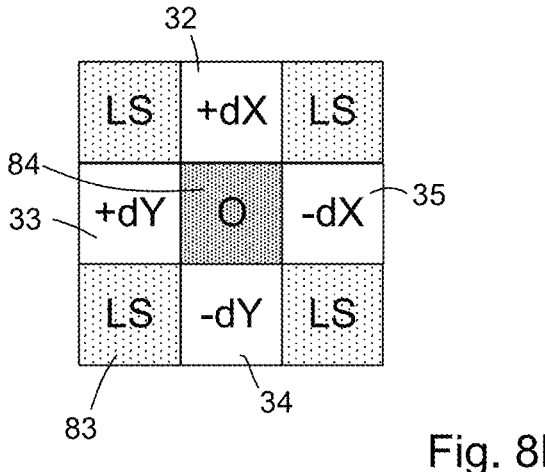
FIG. 8B illustrates an overlay target according to an embodiment.

FIG. 8 illustrates a couple of examples of such a target usable for metrology and correction, where FIG. 8(a) is an example of a focus metrology target and FIG. 8(b) is an example of an overlay metrology target. In this example, the target comprises four pads 81, 81', 82, 82' of focus-sensitive gratings 85 (see example detail), paired two-by-two, forming two focus targets. The target also comprises four LS or grating calibration pads 83 comprising line-space gratings 86 (again example detail is shown) having the same pitch P and similar CD as the focus sensitive gratings, but without the "comb" structures (sub-resolution features) on the reticle which makes the target exposed on the substrate therefrom focus sensitive. The target further comprises a central reflective calibration pad or empty calibration pad 84 (labeled O) which comprises no diffracting structures.

The focus pads comprise a first pair of mirrored (mutually reversed) pads 81, 81' and a second pair of mirrored pads 82, 82'. One or more of the grating feature parameters w1, w2, w3 is/are varied between the two pairs of mirrored pads, while the pitch P is not varied. The basic principle of how the focus pads work and how focus is inferred from them has been described and will not be described further. The focus inference detail, number of focus pads and specific form of each focus pad is not relevant to the concept of this disclosure in any case, and the number of focus pads and/or their basic form may differ from illustrated here.

FIG. 8(b) illustrates an equivalent overlay target. In this example, the focus pads are replaced with overlay pads 32, 33, 34, 35 which each may have the same form as its corresponding overlay pad 32, 33, 34, 35 in FIG. 6 (a conventional µDBO overlay target). Once again, the overlay gratings of the pads may have the same pitch as that of the gratings of the LS pads; however the overlay gratings are compound gratings formed in two layers, typically but optionally with a bias (e.g., biases +d, −d). Optionally, as shown here, overlay targets in the two directions of the substrate plane may be provided. The overlay inference detail, number of overlay pads and specific form of each overlay pad is not relevant to the concept of this disclosure, and the number of overlay pads and/or their basic form may differ from illustrated here.

In either case, during the normal measurement sequence, the intensity of the LS calibration pad(s) 83 and (where applicable) empty calibration pad(s) 84 are captured at the same time (e.g. within the same acquisition) and therefore with the same acquisition settings as the other sub-targets. As such, it is proposed that the target disclosed herein may be measured in a single acquisition as is the case with present multi-pad targets (e.g., such as the overlay target illustrated in FIG. 6, the single acquisition measurement of which is illustrated in FIG. 7). This may be the case for measurements at all the metrology points of the wafer.

Because there are (optionally) multiple symmetric gratings on the target, it is possible to generate an approximation of the intensity profile within the illumination spot. An intensity value may be determined for each of the LS calibration pads 83. The intensity value may be obtained from at least one diffraction order (e.g., the +1 or −1 diffraction orders) or averaged over two complementary diffraction orders (e.g., the +1 and −1 diffraction orders). The intensity values may be obtained from images at an image plane of the metrology system. Each intensity value will be obtained via a respective different portion of the measurement spot because each LS calibration pad 83 will be in a respective different position within the measurement spot during an acquisition. This allows an intensity map to be determined, from which scaling corrections can be applied to the focus or overlay sensitive gratings in order to cancel out the effect of spot inhomogeneity issues. As an alternative (or in addition), one or more LS calibration pads may be moved around within the target (and therefore the measurement spot) with respect to the parameter of interest sensitive pads, such that the measurement spot profile can be measured over a number of measurements of such targets. This embodiment is described in more detail later.

Additionally, because the gratings of the LS calibration pad(s) 83 are symmetric, any asymmetry measured on them is a result of the sensor (sensor asymmetry) or process artifacts. This automatically provides sufficient data to compute a position-dependent sensor asymmetry correction (or tool asymmetry correction) with full wafer density and without additional overhead time. This correction can be applied to the parameter of interest inference in real time.

The method may comprise measuring the asymmetry in the measured signal from at least one LS calibration pad 83 per target and attributing this asymmetry to sensor asymmetry. This can then be used as a sensor asymmetry correction used to correct (e.g., to subtract from) measurements from the main metrology pads (e.g., overlay or focus pads). This can be done for each target at different locations over the wafer. In this way, the position-dependent sensor asymmetry effect can be corrected.

Additionally, the same measurement data from the LS calibration pads, as measured to correct spot inhomogeneity, can also be used to detect (e.g., small) process variations that cause variations in the total light diffracted by the grating. Since the LS calibration pads are not focus or overlay sensitive (or, at least, much less sensitive than the real targets) a (e.g., spatial) variation in the measured intensity from these pads will be directly related to a process variation, and as such this variation can be measured and process variation detected. Additionally, for added precision, the intensities of multiple neighboring LS calibration pads (for example, within the same field) can be averaged, since the spatial frequency of the process variations is larger than the typical density of the targets within the field. It would be impossible to do this with conventional monitoring key performance indicators (KPIs) which use intensities from the parameter of interest sensitive targets because the signal of the process variation will be masked by the intrafield variations of the parameter of interest.

Because the empty pad(s) 84 does not contain any structure, it should not produce any intensity in the dark field image, for which the zeroth order (specularly reflected) radiation is blocked and the image comprises only higher order diffracted radiation. Any residual intensity measured in this location corresponds to ghost intensity. As such, a measurement of this residual intensity of the image portion corresponding to the empty pad can be used as a ghost correction (e.g., can be subtracted from the parameter of interest pad measurements).

Intensity uniformity (e.g., across wafer) may be determined across the images of the calibration gratings (either or both types of the calibration gratings 83, 84) in order to detect possible parallax effects. Since these pads are not focus or overlay dependent, its intensity variation across the wafer should be small (mostly driven by process variations). Therefore an intensity map from the calibration targets may be determined from all the wafer locations, and any steep intensity changes (e.g., above a threshold change) may be detected, which would indicate the presence of parallax effect.

In an embodiment, the positions of the calibration pads within the target may be varied with intrafield position. For example, a reticle used to pattern these targets may be designed in such way that different intrafield locations may comprise one or more calibration gratings (of either or both types described herein) in different locations. This may enable, for example, a more detailed mapping of the spot inhomogeneity and ghost intensity distributions, as more positions within the measurement spot may be sampled. It also means that each individual target can have fewer calibration targets while still being able to characterize spot inhomogeneity properly, for example. This can save on reticle/substrate real-estate and/or allow for more actual metrology pads (parameter of interest sensitive pads) per target.

Figure 9:
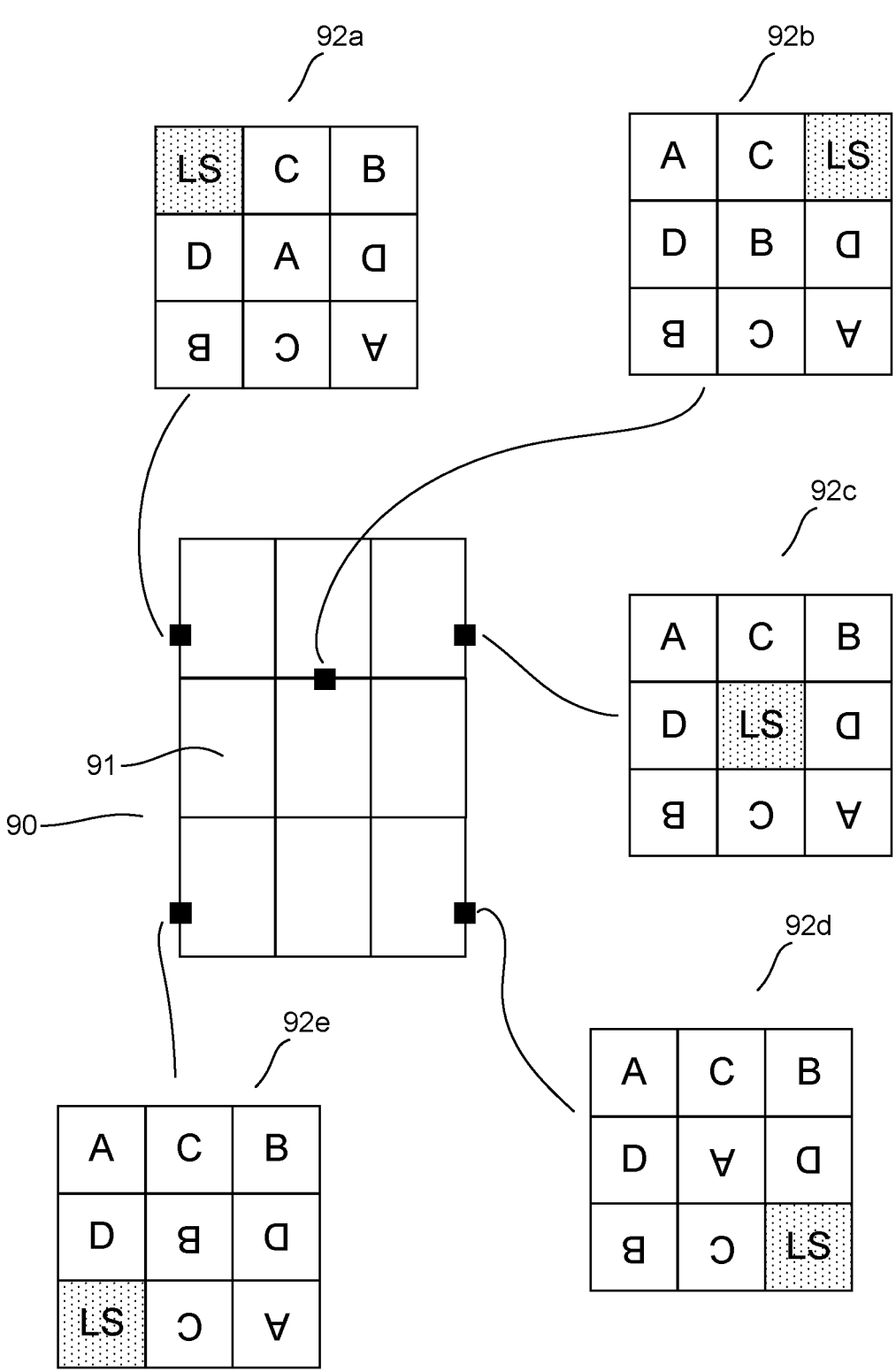
FIG. 9 schematically depicts an example field arrangement comprising multiple focus targets according to an embodiment, where the position of a focus insensitive calibration pad is varied from target-to-target.

FIG. 9 illustrates an example of such an embodiment. The Figure shows schematically a field 90, here comprising 9 dies 91. The field in this example has five metrology points, each comprising a target 92a, 92b, 92c, 92d, 92e. In this example, each target comprises eight parameter of interest sensitive pads (in this specific example, focus pads) which allow for more target combinations in order to increase accuracy in inferring the parameter of interest and one LS calibration pad, which is located at a different position within the target at each intrafield location. This allows for an average mapping of spot inhomogeneity while maximizing the space on the target dedicated to parameter of interest sensitive gratings.

Therefore, disclosed within is a target concept which enables calibration, correction and/or monitoring of issues such as spot inhomogeneity, (e.g., internal and external) ghost calibration, sensor asymmetry, stack cross-talk, and parallax effects without any wafer overhead or throughput reduction. The target may be measured in a single acquisition. Corrections can be made with full wafer density and measured with exactly the same acquisition settings and same stack as for the actual parameter of interest measurements. Direct qualitative wafer maps of process variation can be made from such targets. Calibration data can be obtained over whole wafer (all metrology points), therefore correction may be position dependent, e.g., interfield and intrafield.

Further embodiments of the present method, computer program, non-transient computer program carrier, processing arrangement, metrology device and substrate are disclosed in the subsequent list of numbered clauses:

1. A method of determining a correction for a measurement of at least one target on a substrate, the target comprising one or more focus sensitive sub-targets, each of which has each been formed on said substrate with a focus-dependent asymmetry, and one or more focus insensitive sub-targets, each of which has each been formed on said substrate with less or no focus-dependent asymmetry, the method comprising:

obtaining a respective focus value relating to each of said one or more focus sensitive sub-targets;

obtaining a respective second measurement parameter value relating to each of said one or more focus insensitive sub-targets; and determining a correction for each said focus value using said second measurement parameter values and/or detecting the presence of an effect likely to impact accuracy of focus values from said second measurement parameter values.

2. A method as defined in clause 1, wherein at least one of said one or more focus insensitive sub-targets is a periodic calibration sub-target comprising a symmetric periodic structure.

3. A method as defined in clause 2, wherein each said periodic calibration sub-target is comprised within a single layer.

4. A method as defined in clause 2 or 3, wherein said symmetric periodic structure of each said periodic calibration sub-target is a line-space grating.

5. A method as defined in any of clauses 2 to 4, wherein each of said focus sensitive sub-targets comprises a periodic structure and the pitch of the focus sensitive sub-targets is the same as the pitch of the periodic calibration sub-targets.

6. A method as defined in any of clauses 2 to 5, wherein a critical dimension of said focus sensitive sub-targets is the same as the critical dimension of the periodic calibration sub-targets or sufficiently similar such that each produce an intensity signal under the same illumination conditions within a dynamic range of a sensor used for said measuring step.

7. A method as defined in any of clauses 2 to 6, comprising measuring an asymmetry in said one or more periodic calibration sub-targets from said second measurement parameter values; and determining said correction as a correction for sensor asymmetry from the determined asymmetry in said one or more periodic calibration sub-targets.

8. A method as defined in clause 7, wherein said asymmetry is measured as a difference, measured from the same focus insensitive sub-target, between a positive second measurement parameter value relating to a positive higher diffraction order and a negative second measurement parameter value relating to a complementary negative higher diffraction order.

9. A method as defined in clause 7 or 8, comprising measuring said asymmetry for a plurality of different targets over said substrate to obtain a plurality of asymmetry values; and determining, from said plurality of asymmetry values, said correction for sensor asymmetry as a substrate position dependent correction for sensor asymmetry.

10. A method as defined in any of clauses 2 to 9, wherein the target comprises a plurality of said periodic calibration sub-targets.

11. A method as defined in any of clauses 2 to 10, comprising measuring a plurality of said targets on said substrate, wherein the position of at least one of said one or more periodic calibration sub-targets is varied within the target, from target-to-target.

12. A method as defined in clause 10 or 11, wherein said correction is a spot inhomogeneity correction which corrects for inhomogeneity of a measurement beam used measure said target in the measuring step.

13. A method as defined in clause 12, comprising using said second measurement parameter values from different positions within the or each target to determine said spot inhomogeneity correction.

14. A method as defined in clause 13, wherein said second measurement parameter values from different positions within the or each target to characterize the spot inhomogeneity.

15. A method as defined in any of clauses 10 to 14, comprising using said second measurement parameter values from different positions within the or each target to detect process variation which results in variation in diffracted radiation from the periodic calibration sub-targets.

16. A method as defined in clause 15, wherein said process variation is determined to be present when variation in said second measurement parameter values between the periodic calibration sub-target(s) of different targets or groups of targets is determined to be above a threshold.

17. A method as defined in clause 16, comprising averaging said second measurement parameter values from each field or neighboring group of targets when determining said process variation, and determining said variation between said groups.

18. A method as defined in any preceding clause, wherein at least one of said one or more focus insensitive sub-targets comprises an empty calibration sub-target comprising no diffractive structure.

19. A method as defined in clause 18, comprising determining a residual second measurement parameter value from said empty calibration sub-target; and determining said correction as a ghost correction from said residual second measurement parameter value.

20. A method as defined in clause 19, comprising measuring said residual second measurement parameter value for a plurality of different targets over said substrate; and determining said ghost correction as a substrate position dependent ghost correction.

21. A method as defined in any preceding clause, comprising assessing uniformity in said second measurement parameter values across the substrate and determining a parallax effect to be present if the rate of change of intensity is above a threshold.

22. A method as defined in any preceding clause, wherein said focus value(s) and said second measurement parameter value(s) comprise intensity values or a related metric.

23. A method as defined in any preceding clause, wherein said step of determining a correction is performed in real-time for each measurement of a target of said at least one target.

24. A method as defined in any preceding clause, comprising measuring said target to obtain said focus values and second measurement parameter values.

25. A method as defined in clause 24, wherein said measuring step comprises capturing said target within a single image.

26. A method as defined in clause 25, wherein said measuring step comprises capturing said target within a single measurement acquisition.

27. A computer program comprising program instructions operable to perform the method of any of any of clauses 1 to 25, when run on a suitable apparatus.

28. A non-transient computer program carrier comprising the computer program of clause 27.

29. A processing arrangement comprising:
the non-transient computer program carrier of clause 28; and
a processor operable to run the computer program comprised on said non-transient computer program carrier.

30. A metrology device being operable to perform the method as disclosed in any of clauses 1 to 26.

31. A metrology device as defined in clause 30, comprising:
a substrate support for supporting said substrate; and
an optical system for capturing scattered radiation having been scattered from said target on said substrate; and
a detector for detecting the captured scattered radiation.

32. A metrology device as defined in clause 30 or 31 comprising a scatterometry device.

33. A metrology device as defined in clause 32 comprising a dark-field scatterometry device wherein the detected captured scattered radiation comprises no zeroth order reflected radiation from the target.

34. A substrate comprising:
at least one target comprising one or more focus sensitive sub-targets, each of which has each been formed on said substrate with a focus-dependent asymmetry, and one or more focus insensitive sub-targets, each of which has each been formed on said substrate with less or no focus-dependent asymmetry.

35. A substrate as defined in clause 34, wherein at least one of said one or more focus insensitive sub-targets is a periodic calibration sub-target comprising a symmetric periodic structure.

36. A substrate as defined in clause 35, wherein each said periodic calibration sub-target is comprised within a single layer.

37. A substrate as defined in clause 36 or 37, wherein said symmetric periodic structure of each said periodic calibration sub-target is a line-space grating.

38. A substrate as defined in any of clauses 35 to 37, wherein each of said focus sensitive sub-targets comprises a periodic structure and the pitch of the focus sensitive sub-targets is the same as the pitch of the periodic calibration sub-targets.

39. A substrate as defined in any of clauses 35 to 38, wherein a critical dimension of said focus sensitive sub-targets is the same or similar as the critical dimension of the periodic calibration sub-targets.

40. A substrate as defined in any of clauses 35 to 39, wherein the target comprises a plurality of said periodic calibration sub-targets.

41. A substrate as defined in any of clauses 35 to 40, comprising a plurality of said targets, wherein the position of at least one of said one or more periodic calibration sub-targets is varied within the target, from target-to-target.

42. A substrate as defined in any of clauses 34 to 41, wherein at least one of said one or more focus insensitive sub-targets comprises an empty calibration sub-target comprising no diffractive structure.

43. A substrate as defined in any of clauses 34 to 42, wherein each target of said at least one target is measurable within a measurement spot of a metrology tool.

44. A substrate as defined in any of clauses 34 to 43, wherein each target of said at least one target is smaller than 30 μm in each dimension of the substrate plane.

45. A substrate as defined in any of clauses 34 to 44, wherein each target of said at least one target is smaller than 20 μm in each dimension of the substrate plane.

46. A method of determining a correction for respective measurements of one or more targets comprising a plurality of parameter of interest insensitive sub-targets on a substrate, said one or more targets comprising a plurality of parameter of interest insensitive sub-targets such that each target comprises one or more of said parameter of interest sensitive sub-targets which are each sensitive to a parameter of interest and one or more parameter of interest insensitive sub-targets which are substantially less sensitive or insensitive to the parameter of interest, the method comprising:
obtaining a respective first measurement parameter value relating to each of said one or more parameter of interest sensitive sub-targets;
obtaining a plurality of second measurement parameter values, said plurality of second measurement parameter values comprising a respective second measurement parameter value relating to each of said plurality of parameter of interest insensitive sub-targets, at least some of said plurality of second measurement parameter values relating to a different region of a measurement beam used to measure said one or more targets; and
determining a spot inhomogeneity correction which corrects for inhomogeneity of said measurement beam, for each said first measurement parameter value using said second measurement parameter values.

47. A method as defined in clause 46, wherein at least some of said parameter of interest insensitive sub-targets each comprises a periodic calibration sub-target comprising a symmetric periodic structure.

48. A method as defined in clause 46 or 47, wherein said second measurement parameter values comprise intensity values or a related metric of at least one diffraction order from each said plurality of parameter of interest insensitive sub-targets.

49. A method as defined in any of clauses 46 to 48, comprising determining an intensity map describing intensity within at least one or more portions of the measurement beam; and determining said spot inhomogeneity correction from said intensity map.

50. A method as defined in any of clauses 46 to 49, wherein at least one of said one or more targets each comprises a plurality of parameter of interest insensitive sub-targets.

51. A method as defined in any of clauses 46 to 50, wherein said one more targets comprises a plurality of targets on said substrate, and wherein the position of at least one of said one or more parameter of interest insensitive sub-targets is varied within the target with respect to each of said one or more parameter of interest sensitive sub-targets, for respective different targets of said plurality of targets.

52. A method as defined in any of clauses 46 to 51, comprising an initial measurement step to measure each of said one or more targets to obtain said first measurement parameter values and said second measurement parameter values;

wherein each measurement of a respective target is captured within a single acquisition with said target within the measurement beam.

53. A method as defined in any of clauses 46 to 52, further comprising:

determining said asymmetry in said one or more parameter of interest insensitive sub-targets, for a plurality of different targets over said substrate to obtain a plurality of asymmetry values; and determining, from said plurality of asymmetry values, a substrate position dependent correction for sensor asymmetry.

54. A method as defined in any of clauses 46 to 53, further comprising using said second measurement parameter values to detect process variation which results in variation in diffracted radiation from the parameter of interest insensitive sub-targets.

55. A method as defined in clause 54, wherein said process variation is determined to be present when variation in said second measurement parameter values between the parameter of interest insensitive sub-target(s) of different targets or groups of targets is determined to be above a threshold.

56. A method as defined in clause 54 or 55, comprising averaging said second measurement parameter values from each field or neighboring group of targets when determining said process variation, and determining said variation between said groups.

57. A method as defined in any of clauses 46 to 56, wherein at least one of said one or more parameter of interest insensitive sub-targets comprises an empty calibration sub-target comprising no diffractive structure; the method comprising:

determining a residual second measurement parameter value from said empty calibration sub-target; and determining a ghost correction from said residual second measurement parameter value.

58. A method as defined in clause 57, comprising measuring said residual second measurement parameter value for a plurality of different targets over said substrate; and determining said ghost correction as a substrate position dependent ghost correction 59. A method as defined in any of clauses 46 to 58, comprising:

assessing uniformity in said second measurement parameter values across the substrate; and determining a parallax effect to be present if the rate of change of intensity is above a threshold.

60. A method as defined in any of clauses 46 to 59, comprising determining an asymmetry in each said plurality of parameter of interest sensitive sub-targets to obtain said first measurement parameter values.

61. A method as defined in any of clauses 46 to 60, wherein said first measurement parameter value(s) and said second measurement parameter values are obtained via scatterometry measurements at an image plane.

62. A method as defined in any of clauses 46 to 61, wherein each said parameter of interest insensitive sub-target is comprised within a single layer.

63. A method as defined in any of clauses 46 to 62, wherein each said parameter of interest insensitive sub-target is a line-space grating.

64. A method as defined in any of clauses 46 to 63, wherein each of said parameter of interest sensitive sub-targets comprises a periodic structure and the pitch of the parameter of interest sensitive sub-targets is the same as the pitch of the parameter of interest insensitive sub-targets.

65. A method as defined in any of clauses 46 to 64, wherein a critical dimension of said parameter of interest sensitive sub-targets is the same as the critical dimension of the parameter of interest insensitive sub-targets or sufficiently similar such that each produce an intensity signal under the same illumination conditions within a dynamic range of a sensor used for said measuring step.

66. A method as defined in any of clauses 46 to 65, comprising using said second measurement parameter values from different positions within the or each target to determine said spot inhomogeneity correction.

67. A method as defined in clause 66, wherein said second measurement parameter values from different positions within the or each target to characterize the spot inhomogeneity.

68. A method as defined in any of clauses 46 to 67, wherein said parameter of interest sensitive sub-targets comprise overlay targets and said parameter of interest is overlay.

69. A method as defined in any of clauses 46 to 67, wherein said parameter of interest sensitive sub-targets comprise focus targets and said parameter of interest is focus.

70. A method as defined in any of clauses 46 to 69, wherein said step of determining a correction is performed in real-time for each measurement of a target of said at least one target.

71. A method as defined in any of clauses 46 to 70, comprising measuring said target to obtain said first measurement parameter values and second first measurement parameter values.

72. A method as defined in clause 71, wherein said measuring step comprises capturing said target within a single image.

73. A method as defined in clause 72, wherein said measuring step comprises capturing said target within a single measurement acquisition.

74. A computer program comprising program instructions operable to perform the method of any of any of clauses 46 to 73, when run on a suitable apparatus.

75. A non-transient computer program carrier comprising the computer program of clause 74.

76. A processing arrangement comprising:

the non-transient computer program carrier of clause 75; and a processor operable to run the computer program comprised on said non-transient computer program carrier.

77. A metrology device being operable to perform the method as disclosed in any of clauses 46 to 73.

78. A metrology device as defined in clause 77, comprising:

a substrate support for supporting said substrate; and an optical system for capturing scattered radiation having been scattered from said target on said substrate; and a detector for detecting the captured scattered radiation.

79. A metrology device as defined in clause 77 or 78 comprising a scatterometry device.

80. A metrology device as defined in clause 79 comprising a dark-field scatterometry device wherein the detected captured scattered radiation comprises no zeroth order reflected radiation from the target.

81. A substrate comprising:

a plurality of targets, each target comprising one or more parameter of interest sensitive sub-targets which are each sensitive to a parameter of interest and one or more parameter of interest insensitive sub-targets which are substantially less sensitive or insensitive to the parameter of interest; and wherein the position of at least one of said one or more parameter of interest insensitive sub-targets is varied within the target with respect to each of said one or more parameter of interest sensitive sub-targets, for respective different targets of said plurality of targets.

82. A substrate as defined in clause 81, wherein at least some of said parameter of interest insensitive sub-targets is each a periodic calibration sub-target comprising a symmetric periodic structure.

83. A substrate as defined in clause 81, wherein each said parameter of interest insensitive sub-target is comprised within a single layer.

84. A substrate as defined in clause 81 or 83, wherein said each said parameter of interest insensitive sub-target is a line-space grating.

85. A substrate as defined in any of clauses 81 to 84, wherein each of said parameter of interest sensitive sub-targets comprises a periodic structure and the pitch of the parameter of interest sensitive sub-targets is the same as the pitch of the parameter of interest insensitive sub-targets.

86. A substrate as defined in any of clauses 81 to 85, wherein a critical dimension of said parameter of interest sensitive sub-targets is the same or similar as the critical dimension of the parameter of interest insensitive sub-targets.

87. A substrate as defined in any of clauses 81 to 86, wherein at least one of said one or more targets each comprises a plurality of parameter of interest insensitive sub-targets.

88. A substrate as defined in any of clauses 81 to 87, wherein at least one of said one or more parameter of interest insensitive sub-targets comprises an empty calibration sub-target comprising no diffractive structure.

89. A substrate as defined in any of clauses 81 to 88, wherein said parameter of interest sensitive sub-targets comprise overlay targets.

90. A substrate as defined in any of clauses 81 to 89, wherein said parameter of interest sensitive sub-targets comprise focus targets.

91. A substrate as defined in any of clauses 81 to 90, wherein each target of said at least one target is measurable within a measurement spot of a metrology tool.

92. A substrate as defined in any of clauses 81 to 91, wherein each target of said at least one target is smaller than 30 μm in each dimension of the substrate plane.

93. A substrate as defined in any of clauses 81 to 92, wherein each target of said at least one target is smaller than 20 μm in each dimension of the substrate plane.

94. A method of determining a correction for a measurement of a plurality of targets on a substrate, each target comprising one or more parameter of interest sensitive sub-targets which are each sensitive to a parameter of interest and one or more parameter of interest insensitive sub-targets which are substantially less sensitive or insensitive to the parameter of interest, the method comprising:

obtaining a respective first measurement parameter value relating to each of said one or more parameter of interest sensitive sub-targets;

obtaining a respective second measurement parameter value relating to an asymmetry in each of said one or more parameter of interest insensitive sub-targets; and determining a substrate position dependent correction for sensor asymmetry for each said first measurement parameter value from said plurality of asymmetry values.

95. A method as defined in clause 94, wherein at least one of said one or more parameter of interest insensitive sub-targets is a parameter of interest insensitive sub-target comprising a symmetric periodic structure.

96. A method as defined in clause 94, wherein each said parameter of interest insensitive sub-target is comprised within a single layer.

97. A method as defined in clause 94 or 95, wherein said symmetric periodic structure of each said parameter of interest insensitive sub-target is a line-space grating.

98. A method as defined in any of clauses 94 to 97, wherein each of said parameter of interest sensitive sub-targets comprises a periodic structure and the pitch of the parameter of interest sensitive sub-targets is the same as the pitch of the parameter of interest insensitive sub-targets.

99. A method as defined in any of clauses 94 to 98, wherein a critical dimension of said parameter of interest sensitive sub-targets is the same as the critical dimension of the parameter of interest insensitive sub-targets or sufficiently similar such that each produce an intensity signal under the same illumination conditions within a dynamic range of a sensor used for said measuring step.

100. A method as defined in any of clauses 94 to 99, comprising measuring an asymmetry in said one or more parameter of interest insensitive sub-targets from said second measurement parameter values; and determining said correction for sensor asymmetry from the determined asymmetry in said one or more parameter of interest insensitive sub-targets.

101. A method as defined in clause 100, wherein said asymmetry is measured as a difference, measured from the same parameter of interest insensitive sub-target, between a positive second measurement parameter value relating to a positive higher diffraction order and a negative second measurement parameter value relating to a complementary negative higher diffraction order.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
   obtaining a respective focus value relating to each of one or more focus sensitive sub-targets of each of multiple targets on a substrate;
   obtaining a respective second measurement parameter value relating to each of one or more focus insensitive sub-targets of each of the multiple targets; and
   determining a correction for each the focus values using the second measurement parameter values and/or detecting a presence of an effect likely to impact accuracy of focus values from the second measurement parameter values,
   wherein a position of at least one of the one or more focus insensitive sub-targets within each of the multiple targets is varied between each target in the multiple targets such that the at least one of the one or more focus insensitive sub-targets in each of the multiple targets measures a different portion of a measurement beam.

2. The method of claim 1, wherein at least one of the one or more focus insensitive sub-targets is a periodic calibration sub-target comprising a symmetric periodic structure.

3. The method of claim 2, wherein each the periodic calibration sub-target is comprised within a single layer.

4. The method of claim 2, wherein the symmetric periodic structure of each the periodic calibration sub-target is a line-space grating.

5. The method of claim 1, wherein each target comprises a plurality of the focus insensitive sub-targets.

6. The method of claim 1, wherein a correction is a spot inhomogeneity correction that corrects for inhomogeneity of a measurement beam used measure the targets in the measuring step.

7. The method of claim 1, further comprising using the second measurement parameter values from different positions within each target to detect process variation that results in variation in diffracted radiation from at least one of the one or more focus insensitive sub-targets.

8. The method of claim 1, wherein at least one of the one or more focus insensitive sub-targets comprises an empty calibration sub-target comprising no diffractive structure.

9. The method of claim 1, wherein the focus value(s) and the second measurement parameter value(s) comprise intensity values or a related metric.

10. The method of claim 1, wherein the determining a correction is performed in real-time for each measurement of a target of the multiple targets.

11. A non-transitory computer program product comprising machine-readable instructions therein, the instructions, upon execution by a computer system, configured to cause the computer system to at least cause performance of the method of claim 1.

12. A target assembly comprising:
   a plurality of targets having different locations on a substrate, wherein each target in the plurality of targets includes one or more focus sensitive sub-targets which have each been formed on the substrate with a focus-dependent asymmetry; and
   one or more focus insensitive sub-targets which have each been formed on the substrate with less or no focus-dependent asymmetry,
   wherein a position of at least one of the one or more focus insensitive sub-targets within each of the plurality of targets is varied between each target in the plurality of targets such that the at least one of the one or more focus insensitive sub-targets in each of the plurality of targets measures a different portion of a measurement beam.

13. The target assembly of claim 12, wherein at least one of the one or more focus insensitive sub-targets comprises an empty calibration sub-target comprising no diffractive structure.

14. The target assembly of claim 12, wherein each target of the multiple targets is measurable within a measurement spot of a metrology tool.

15. The target assembly of claim 12, wherein each target of the multiple targets is smaller than about 30 μm in each dimension of a plane of the substrate.

* * * * *